United States Patent
Shih

(10) Patent No.: US 7,129,850 B1
(45) Date of Patent: Oct. 31, 2006

(54) AUTOMATICALLY ACTUATABLE SWITCH DEVICE

(76) Inventor: Sen-Tien Shih, No. 773, Jangtsao Road, Changhua 500 (TW)

( * ) Notice: Subject to any disclaimer, the term of this patent is extended or adjusted under 35 U.S.C. 154(b) by 163 days.

(21) Appl. No.: 11/011,821

(22) Filed: Dec. 14, 2004

(51) Int. Cl.
*G08B 23/00* (2006.01)

(52) U.S. Cl. .............. 340/693.5; 340/687; 340/693.9; 340/691.1; 340/332; 307/112

(58) Field of Classification Search ............ 340/693.5, 340/908, 693.9, 687, 691.1, 332, 573.1, 541, 340/565; 200/329, 345, 547, 335, 339; 307/112, 307/125; 174/50
See application file for complete search history.

(56) References Cited

U.S. PATENT DOCUMENTS

| | | | | |
|---|---|---|---|---|
| 4,947,054 A | * | 8/1990 | Flowers et al. ............. | 307/125 |
| 5,015,994 A | * | 5/1991 | Hoberman et al. ......... | 340/567 |
| 5,586,048 A | * | 12/1996 | Coveley ...................... | 702/189 |
| 6,133,843 A | * | 10/2000 | Davidson .................. | 340/693.9 |
| 6,741,163 B1 | * | 5/2004 | Roberts ....................... | 340/330 |
| 6,765,149 B1 | | 7/2004 | Ku ............................... | 174/66 |

* cited by examiner

*Primary Examiner*—Anh V. La
(74) *Attorney, Agent, or Firm*—Charles E. Baxley

(57) ABSTRACT

A switch device includes a housing, a circuit board is disposed in the housing for being coupled between an electric power source and an electric appliance, a remote detecting device includes a light emitting and receiving device for generating lights to detect whether users are going toward the housing of the switch device or not, the remote detecting device includes an indicating light member to indicate whether an electric power energy has been supplied to the remote detecting device or not, and another indicating light member to indicate whether the light emitting and receiving device is working or not. A control device may control the electric appliance, when the light emitting and receiving device has detected that a user is going toward or close to the housing of the switch device.

1 Claim, 3 Drawing Sheets

— 1 —

AUTOMATICALLY ACTUATABLE SWITCH DEVICE

BACKGROUND OF THE INVENTION

1. Field of the Invention

The present invention relates to a switch device, and more particularly to an automatically actuatable switch device which is actuatable by users automatically without being depressed or switched or contacted by the users.

2. Description of the Prior Art

Typically, electric appliances or facilities, such as light devices, fan devices, elevators, etc., are normally coupled to an electric power source via a switch device, and arranged to be actuated or operated by the switch device. Normally, the typical switch devices comprise a switch button depressible by users, or arranged to be pulled by the users.

For example, U.S. Pat. No. 6,765,149 to Ku discloses one of the typical wall boxes having one or more switches disposed in a housing, and arranged to be depressed or actuated or operated by the users.

However, when the typical wall boxes or the typical switch devices are used in public places, such as hospitals, malls, department stores, book stores, restaurants, etc., the typical wall boxes or the typical switch devices will be depressed or contacted by many people, such that germs or bacteria will be easily spread out in the public places via the typical wall boxes or the typical switch devices. It is particularly dangerous when the typical depressing type wall boxes or the switch devices are used in hospitals.

The present invention has arisen to mitigate and/or obviate the afore-described disadvantages of the conventional manually actuated or operated switch devices.

SUMMARY OF THE INVENTION

The primary objective of the present invention is to provide an automatically actuatable switch device which is actuatable by users automatically without being depressed or switched or contacted by the users.

In accordance with one aspect of the invention, there is provided a switch device comprising a housing including a front panel having an opening formed therein, a lens attached to the housing, to enclose the opening of the front panel of the housing, a circuit board disposed in the housing, for being coupled between an electric power source and an electric appliance, a remote detecting device including a light emitting and receiving device for generating lights to detect whether users are going toward the housing of the switch device or not, the remote detecting device includes a first indicating light member attached to the circuit board, to indicate whether an electric power energy has been supplied to the remote detecting device or not, and a second indicating light member is attached to the circuit board, to indicate whether the light emitting and receiving device is working or not, and a control device is coupled to the remote detecting device, for controlling and actuating the electric appliance, when the light emitting and receiving device has detected that an user is going toward or close to the housing of the switch device.

Further objectives and advantages of the present invention will become apparent from a careful reading of the detailed description provided hereinbelow, with appropriate reference to the accompanying drawings.

BRIEF DESCRIPTION OF THE DRAWINGS

FIG. 3 is an electric circuit illustrating the operation of the automatically actuatable switch device for an electric appliance or facility, such as light device, fan device, elevator, or the like.

DETAILED DESCRIPTION OF THE PREFERRED EMBODIMENT

Figure 1:
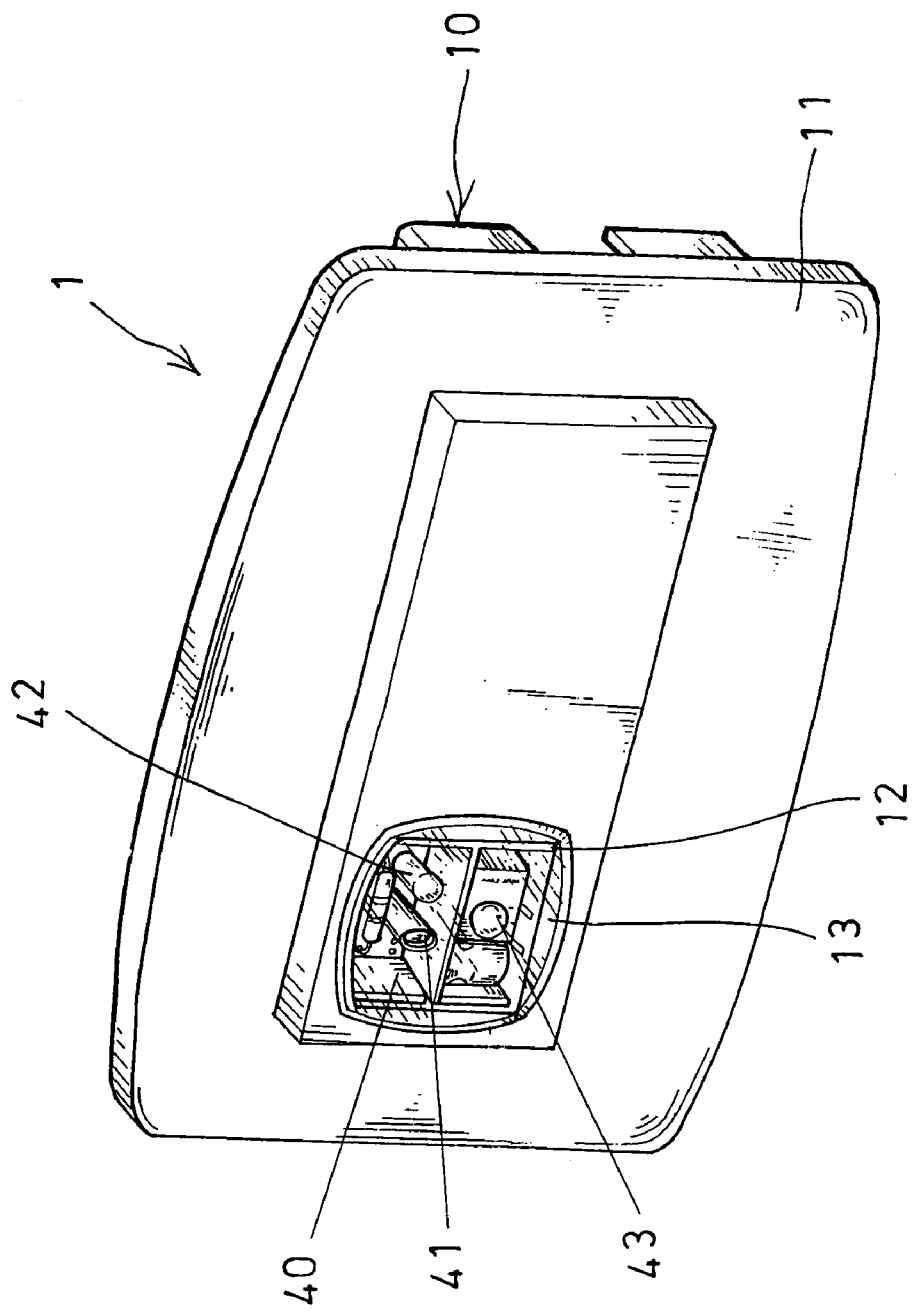
FIG. 1 is a front perspective view of an automatically actuatable switch device in accordance with the present invention.
Figure 2:
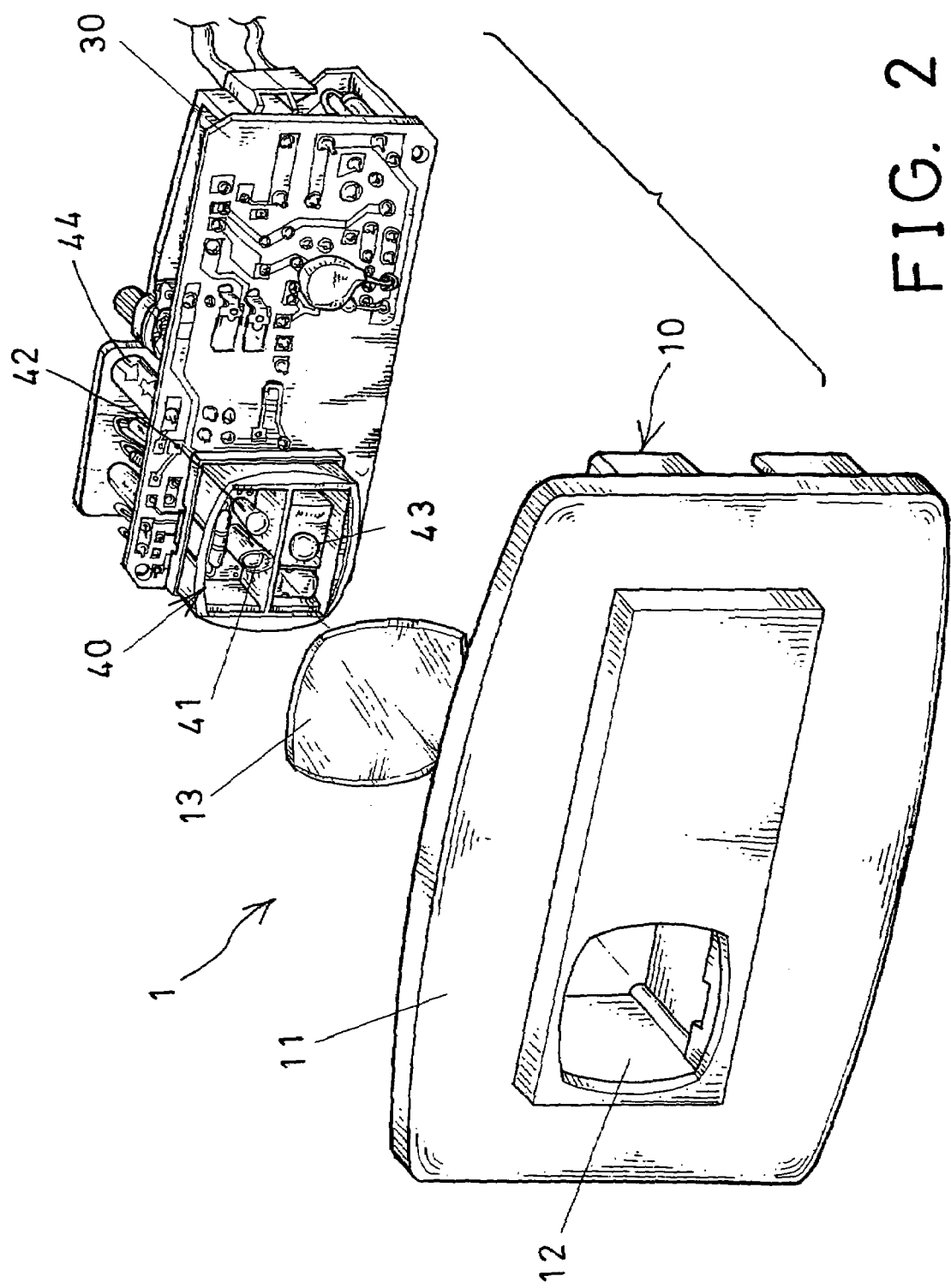
FIG. 2 is a partial exploded view of the automatically actuatable switch device.

Referring to the drawings, and initially to FIGS. 1 and 2, an automatically actuatable switch device 1 in accordance with the present invention comprises a housing 10 including a front panel 11 having an opening 12 formed therein, and blocked or enclosed with a lens 13 that is made of transparent, or semi-transparent materials, for allowing light to pass through the lens 13.

Figure 3:
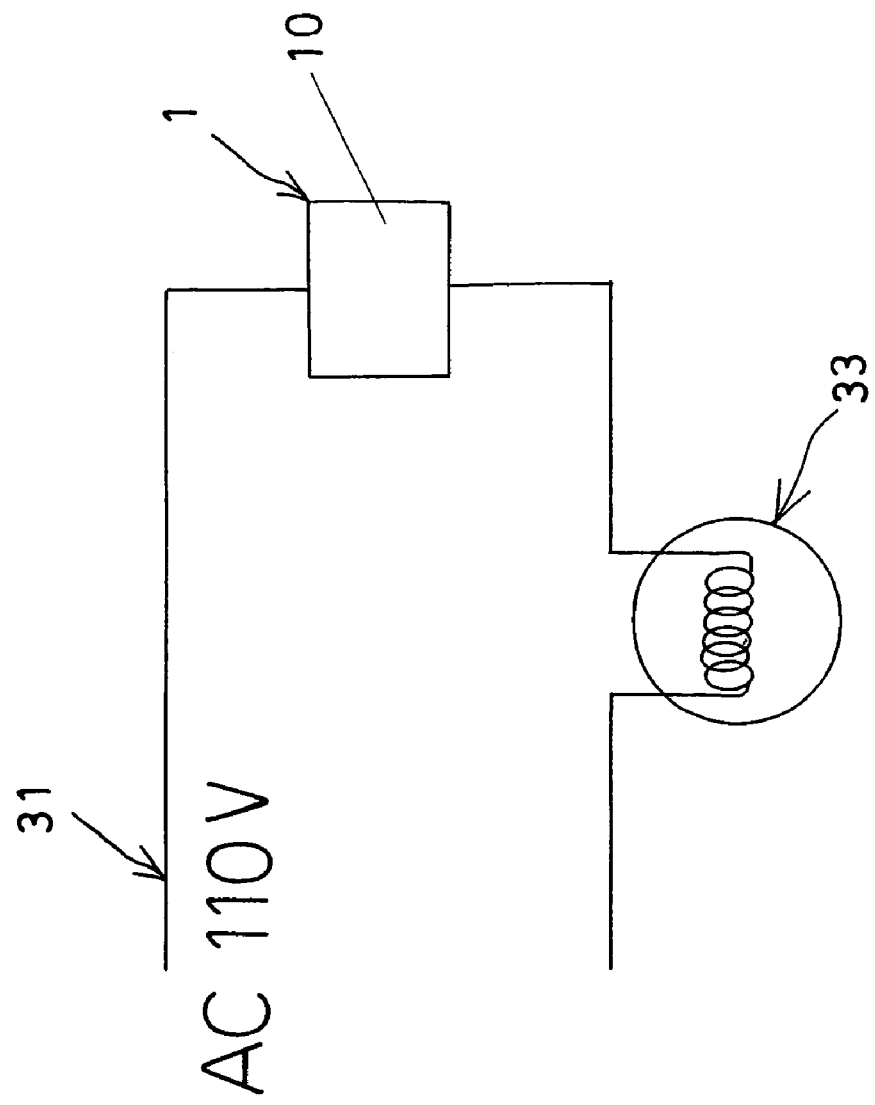

The switch device 1 includes a circuit board 30 disposed in the housing 10, and coupled between an electric power source 31 and a typical electric appliance or facility 33 (FIG. 3), such as light device 33, fan devices, elevators, etc., and includes a remote detecting device 40 having a light emitting module or device 41, such as an infrared light emitting device 41 or an infrared light emitting and/or receiving device 41 for generating infrared rays, to detect whether one or more users are going toward or close to the housing 10 of the switch device 1 or not.

The remote detecting device 40 further includes one or more indicating light members 42 attached to the circuit board 30, to indicate whether an electric power energy has been supplied to the remote detecting device 40 or not, and one or more further indicating light members 43 attached to the circuit board 30, to indicate whether the light emitting and receiving device 41 is working or not.

A control device 44, such as a processor device 44, may be coupled to the remote detecting device 40, and may also be coupled to the electric appliance or facility 33, for being actuated or operated by the remote detecting device 40, to control or to actuate the electric appliance or facility 33, when the light emitting and receiving device 41 has detected that one or more users are going toward or close to the housing 10 of the switch device 1, for example.

In operation, the light emitting and receiving device 41 may generate lights, such as infrared rays out through the lens 13 or the opening 12 of the housing 10, to detect whether one or more users are going toward or close to the housing 10 of the switch device 1 or not.

When light emitting and receiving device 41 has detected that one or more users are going toward or close to the housing 10 of the switch device 1, the control device 44 may control or actuate the electric appliance or facility 33, such that the electric appliance or facility 33 may be actuated or operated automatically via the switch device 1 without being actuated or depressed or contacted or operated by the users manually, and such that germs or bacteria will have no chance to spread out in the public places via the automatically actuatable switch device.

Accordingly, the automatically actuatable switch device in accordance with the present invention is actuatable by users automatically without being depressed or switched or contacted by the users.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A switch device comprising:
   a housing including a front panel having an opening formed therein,
   a lens attached to said housing, to enclose said opening of said front panel of said housing,
   a circuit board disposed in said housing, for being coupled between an electric power source and an electric appliance,
   a remote detecting device including a light emitting and receiving device for generating lights to detect whether users are going toward said housing of said switch device or not,
   said remote detecting device including a first indicating light member attached to said circuit board, to indicate whether an electric power energy has been supplied to said remote detecting device or not, and a second indicating light member attached to said circuit board, to indicate whether said light emitting and receiving device is working or not, and
   a control device coupled to said remote detecting device, for controlling and actuating the electric appliance, when said light emitting and receiving device has detected that a user is going toward or close to said housing of said switch device.

* * * * *